(12) United States Patent
Hsu et al.

(10) Patent No.: US 6,570,207 B2
(45) Date of Patent: May 27, 2003

(54) STRUCTURE AND METHOD FOR CREATING VERTICAL CAPACITOR AND ANTI-FUSE IN DRAM PROCESS EMPLOYING VERTICAL ARRAY DEVICE CELL COMPLEX

(75) Inventors: Louis L. Hsu, Fishkill, NY (US); Jack A. Mandelman, Stormville, NY (US); Carl J. Radens, LaGrangeville, NY (US); William R. Tonti, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 97 days.

(21) Appl. No.: 09/736,496

(22) Filed: Dec. 13, 2000

(65) Prior Publication Data

US 2002/0070403 A1 Jun. 13, 2002

(51) Int. Cl.⁷ .............................. H01L 27/108
(52) U.S. Cl. .............. 257/302; 257/310; 257/532; 257/535; 257/534; 257/905; 438/242
(58) Field of Search ............... 257/302, 310, 257/532, 535, 534, 905; 438/242

(56) References Cited

U.S. PATENT DOCUMENTS

| | | | |
|---|---|---|---|
| 4,269,636 A | | 5/1981 | Rivoli et al. |
| 5,102,817 A | | 4/1992 | Chatterjee et al. |
| 5,122,476 A | | 6/1992 | Fazan et al. |
| 5,208,657 A | * | 5/1993 | Chatterjee et al. .......... 257/302 |
| 5,250,450 A | | 10/1993 | Lee et al. |
| 5,272,102 A | | 12/1993 | Hur et al. |
| 5,365,097 A | | 11/1994 | Kenney |
| 5,376,575 A | | 12/1994 | Kim et al. |
| 5,466,625 A | | 11/1995 | Hsieh et al. |
| 5,519,236 A | * | 5/1996 | Ozaki .......................... 257/302 |
| 5,529,944 A | * | 6/1996 | Rajeevakumar ............... 437/52 |
| 5,536,675 A | | 7/1996 | Bohr |
| 5,656,544 A | | 8/1997 | Bergendahl et al. |
| 5,712,202 A | | 1/1998 | Liaw et al. |
| 5,817,552 A | | 10/1998 | Roesner et al. |
| 5,838,045 A | | 11/1998 | Muller et al. |
| 5,869,392 A | | 2/1999 | Kimura |
| 5,937,296 A | | 8/1999 | Arnold |
| 5,949,700 A | | 9/1999 | Furukawa et al. |
| 5,950,084 A | | 9/1999 | Chao |
| 5,977,579 A | | 11/1999 | Noble |
| 5,981,332 A | * | 11/1999 | Mandelman et al. ....... 438/246 |
| 5,990,509 A | | 11/1999 | Burns, Jr. et al. |
| 5,994,780 A | | 11/1999 | Wang et al. |
| 6,034,389 A | | 3/2000 | Burns, Jr. et al. |
| 6,096,580 A | * | 8/2000 | Iyer et al. .................... 438/132 |
| 6,324,105 B1 | * | 11/2001 | Shirley ....................... 365/200 |
| 6,399,435 B1 | * | 6/2002 | Tihanyi ....................... 438/248 |

* cited by examiner

Primary Examiner—Sara Crane
Assistant Examiner—Junghwa Im
(74) Attorney, Agent, or Firm—Schmeiser, Olsen & Watts; Mark F. Chadurjian

(57) ABSTRACT

An integrated circuit chip is provided having both a conventional DRAM vertical transfer device and an integrated vertical storage capacitor or anti-fuse that can be accessed directly without having to turn on a transfer gate. The mechanism for accessing the integrated capacitor or anti-fuse directly can be a modified doping profile within the vertical cell that provides a low resistance punch-through FET. Alternatively, the mechanism can be a pair of overlapping or nearly overlapping diffusions within the vertical cell.

19 Claims, 10 Drawing Sheets

STRUCTURE AND METHOD FOR CREATING VERTICAL CAPACITOR AND ANTI-FUSE IN DRAM PROCESS EMPLOYING VERTICAL ARRAY DEVICE CELL COMPLEX

FIELD OF THE INVENTION

The technical field of the invention is that of integrated circuit chips, in particular integrated circuit chips including vertical DRAM devices.

BACKGROUND OF THE INVENTION

A conventional DRAM vertical transfer device 10 is shown in cross section in FIG. 1. A FET 11 is vertically connected between the surface bitline 12 and the buried node 13. A transfer gate 14 and an oxide interface formed of a gate oxide 15 and a trench top oxide 16 provide a MOSFET acting vertically. The MOSFET connects below the buried node 13 to a conventional deep trench storage capacitor 17. An oxide collar 18 and capacitor dielectric 19 surround the storage capacitor 17.

A support junction N+ implant 37 is provided for making ohmic contact to an n-well 38. A masked implanted N+ buried layer 39 is formed over the entire decoupling capacitor matrix. An N+ layer 40 is out diffused from each trench using conventional processes. Elements 37, 38, 39 and 40 electrically form a heavily doped N+ common outer capacitor plate with an electrical interface brought to the silicon surface through elements 38 and 37. An inner plate connection is provided by the vertical FET 11. The outer N+ plate 37 electrically isolates the bulk p-silicon 21, and thus forms an isolated p-well 42. The isolated p-well 42 is connected by using a standard CMOS p+ support junction implant 41. Shallow trench isolation regions 20 are formed on each side of the elements 37 and 41.

The conventional DRAM vertical transfer device 10 does not provide a low resistance connection to the inner plate of the capacitor 17 that bypasses the transfer MOSFET device 11. The array bitline diffusion junction 12 in conjunction with the array transistor p-well provides a series device connection whose threshold voltage is on the order of one volt. A doping profile through section 2—2 of FIG. 1 is shown in FIG. 2. By this doping profile it can be seen that the nodes 12 and 13 are not electrically connected, and that the capacitor 17 cannot be accessed directly unless the gate 14 is turned on and the channel is inverted. The transfer device output resistance of this conventional DRAM device 10 is on the order of 100 kΩ, resulting in an RC time constant for a 40 fF capacitor equal to about 4 nS. This time constant is too long to be used effectively as an on-chip high frequency decoupling capacitor. The existing practice of turning on the transfer gate has the disadvantages of adding more nodes than are needed and slowing the response to the capacitor.

SUMMARY OF THE INVENTION

The present invention is directed to a structure and method for creating a vertical capacitor in a DRAM process employing an improved vertical array device cell complex.

According to a broad aspect of the present invention, an electronic structure is provided comprising an integrated circuit chip having a first capacitor and an electrical element, wherein contact to the first capacitor is through a first mechanism comprising a vertical transistor, and contact to the electrical element is through a second mechanism that differs from the first mechanism. The electrical element can be a second capacitor or an anti-fuse.

In one disclosed embodiment, the second mechanism comprises a modified doping profile within the vertical cell that provides a low resistance punch-through FET.

In another disclosed embodiment, the second mechanism comprises a pair of overlapping or nearly overlapping diffusions spaced closely enough that current transport is by punch through.

In another disclosed embodiment, the second mechanism is formed in a shallower recessed trench than the first mechanism, and includes a pair of diffusions that merge and provide a direct connection to the electrical element.

BRIEF DESCRIPTION OF THE DRAWINGS

The present invention will become more clearly appreciated as the disclosure of the invention is made with reference to the accompanying drawings. In the drawings.

DETAILED DESCRIPTION OF THE INVENTION

Figure 1:
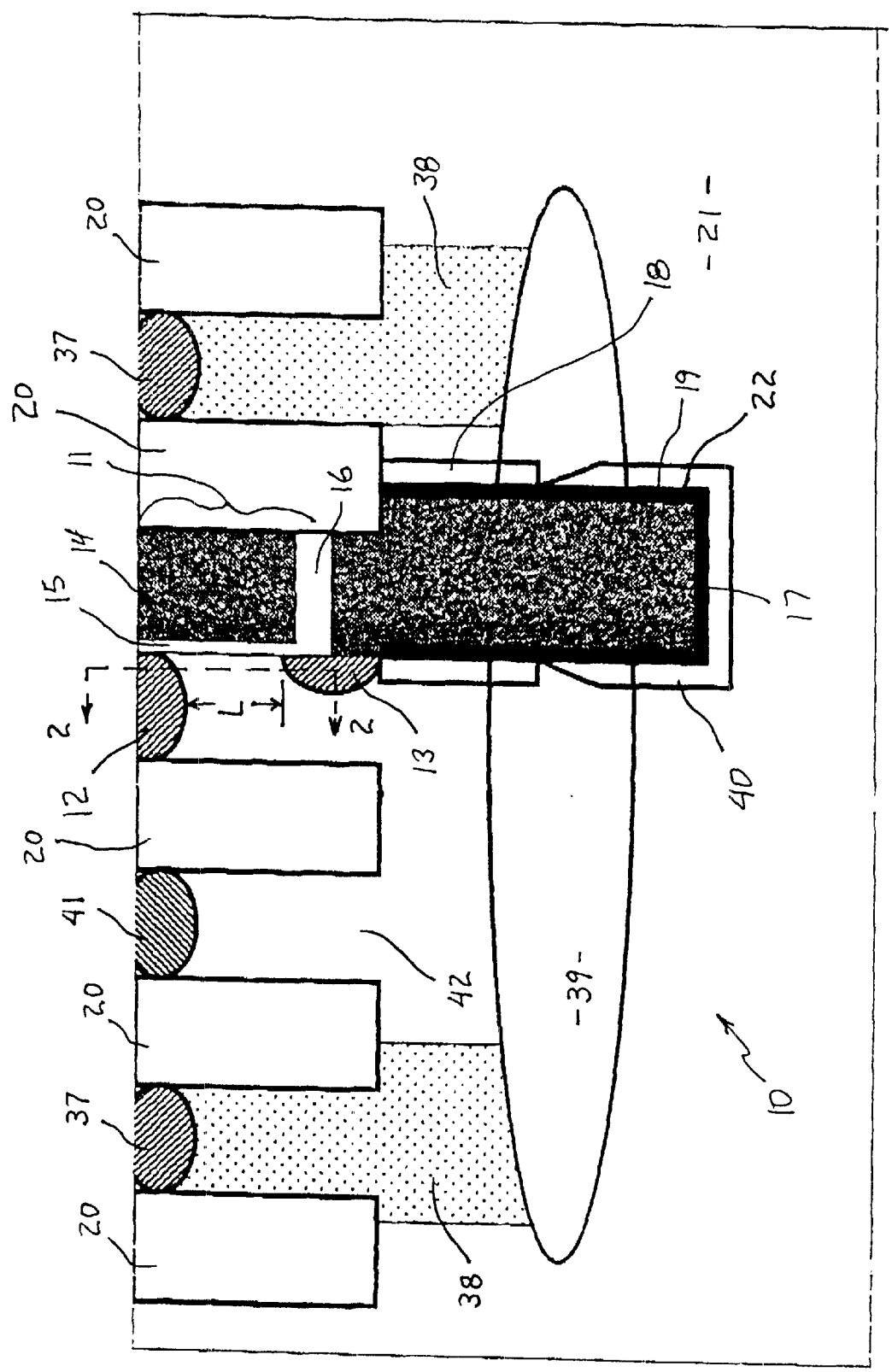
FIG. 1 is a schematic cross section view of a conventional DRAM vertical transfer device.

The present invention provides an electronic structure comprising an integrated circuit chip having both a conventional DRAM vertical transfer device 10 and an integrated vertical storage capacitor (described below) that can be accessed directly without having to turn on a transfer gate. As explained above with reference to FIG. 1, the conventional DRAM vertical transfer device 10 is formed in a first trench 22 and includes a first capacitor 17 having a buried node 13 contacted through a vertical transistor 11. The vertical transistor 11 is a FET and has a vertical gate 14 located in a first trench of the silicon structure 21. An array bitline diffusion junction 12 in conjunction with an array transistor p-well provides a series device connection whose threshold voltage is on the order of one volt. As shown in the doping profile of FIG. 2, the nodes 12 and 13 are not physically connected, and the channel between the nodes is implanted with a conventional p-type well dopant. Thus, the first capacitor 17 cannot be accessed unless the transfer gate 14 is turned on.

Figure 3A:
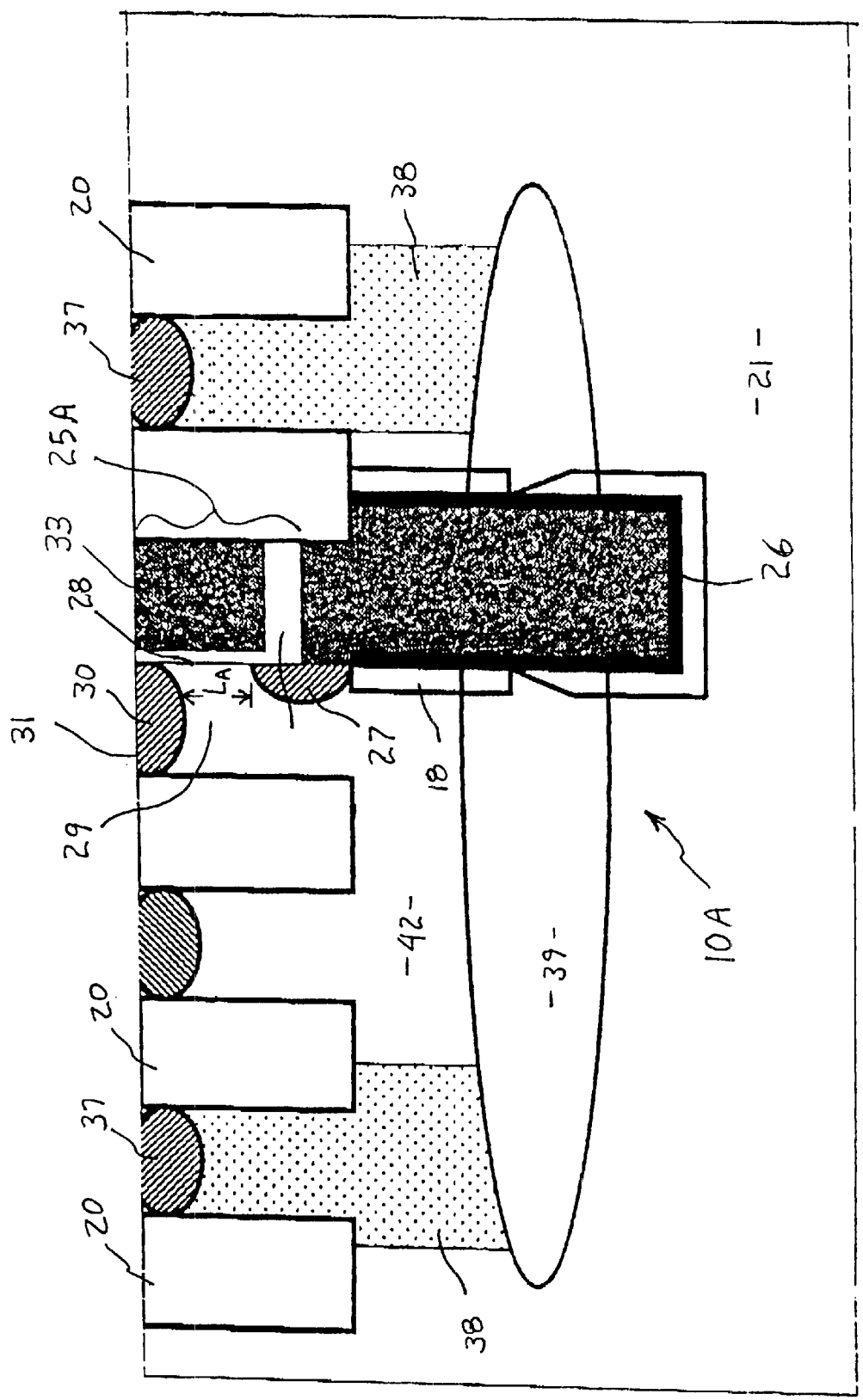
FIG. 3A is a schematic cross section view of a modified vertical array device having decoupling capacitor elements according to a first embodiment of the present invention.
Figure 3B:
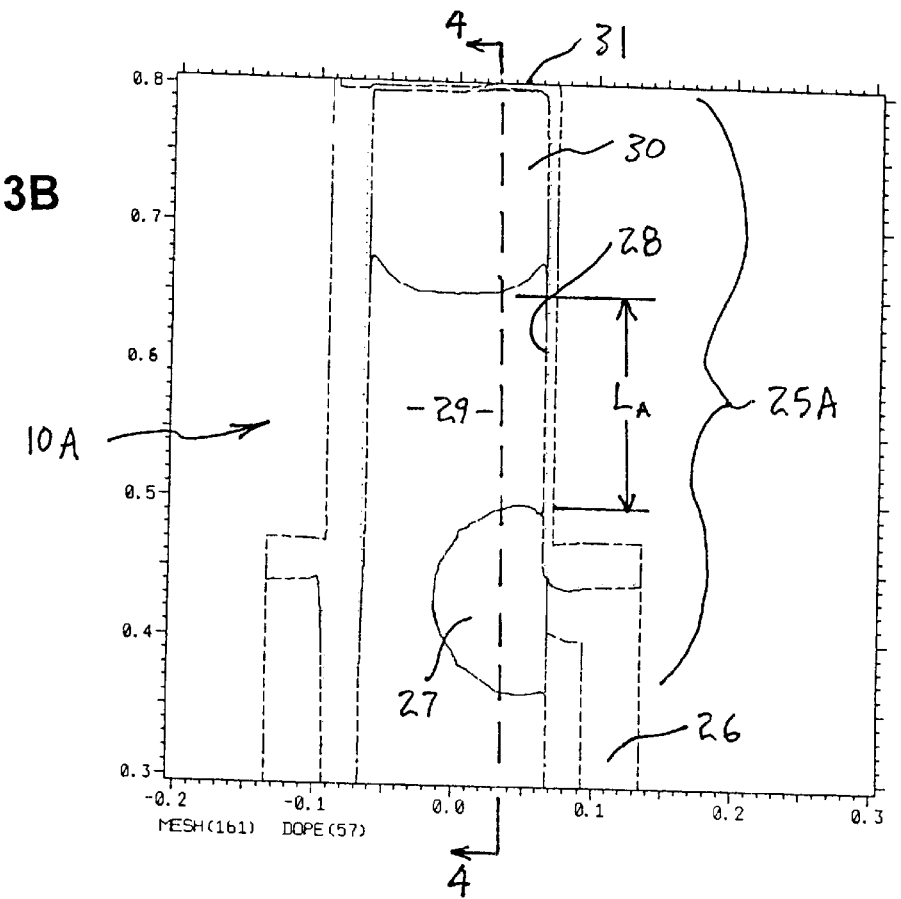
FIG. 3B is a two-dimensional cross section view of a doping profile of the modified vertical array device shown in FIG. 3A.

As shown in FIGS. 3A and 3B, the integrated vertical storage capacitor of the present invention includes a second capacitor 26 having a buried node 27 in a second trench 28 which is contacted through a mechanism that differs from the vertical transistor 11 contacting the capacitor 17 of the DRAM device 10. The formation of a novel mechanism for contacting the buried node 27 for the second capacitor 26 will be described in detail with reference to three embodiments of the present invention shown in the accompanying drawings.

The first embodiment will be described with reference to FIGS. 3A, 3B and 4 of the drawings. The contacting mechanism 25A for the integrated capacitor 10A of this embodiment is provided by modifying the well and junction doping profile of the structure, as compared to that shown in FIGS. 1 and 2. Specifically, the array p-well is not implanted into the channel 29 as in the DRAM device 10, and instead the channel 29 is left at the incoming substrate concentration. Also, the surface bitline junction 30, which comprises a shallow low dose array junction implant, is further implanted with an additional deeper high dose support junction. This results in a decrease in the junction resistance, and an increase in the corresponding junction depth. The array and support dopant can be integrated as a new standard implant complex without added process cost.

Figure 4:
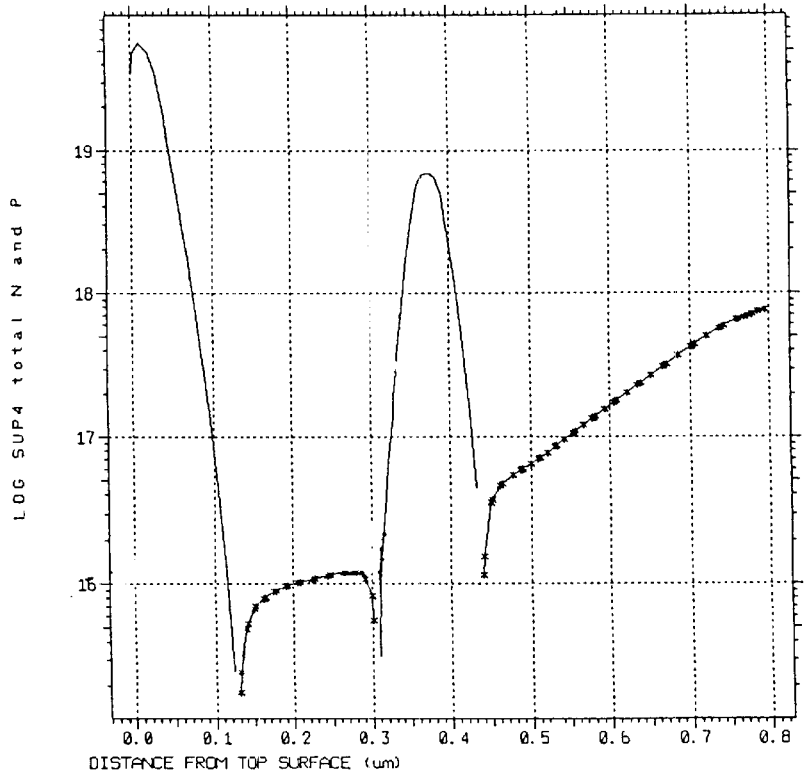
FIG. 4 is a one-dimensional view of the doping profile of the vertical array device of FIGS. 3A and 3B, as taken along line 4—4 in FIG. 3B.

These modifications result in the doping profile from the top surface 31 down through the buried node 27 as shown in FIG. 4. The contacting mechanism 25A of the integrated capacitor 10A is thus provided by implanting, or outdiffusion from, doped poly into the surface bitline junction diffusion 30 in addition to the normal source/drain implant, and by not implanting the array p-well in the channel 29. The result is a vertical contacting mechanism 25A comprising a resistor having a reduced linear resistance and a reduced RC time constant.

Figure 2:
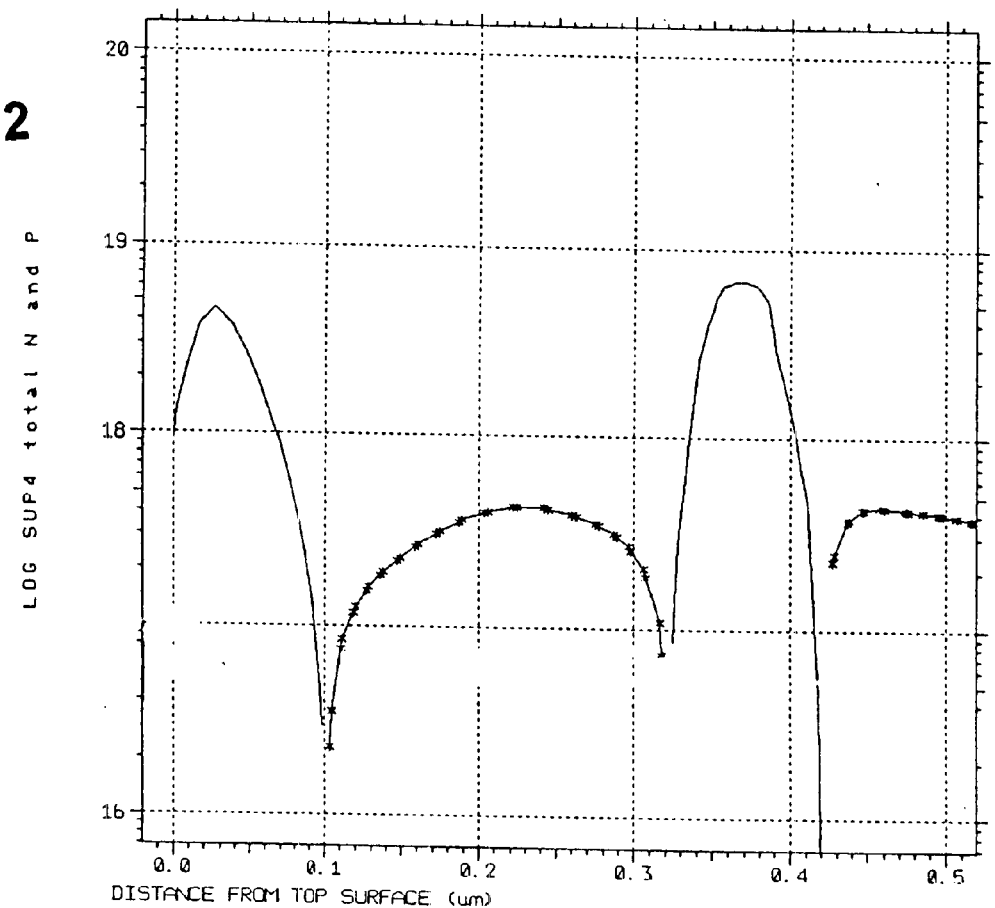
FIG. 2 is a one-dimensional view of a doping profile of the conventional vertical transfer device of FIG. 1, as taken along line 2—2 in FIG. 1.
Figure 7:
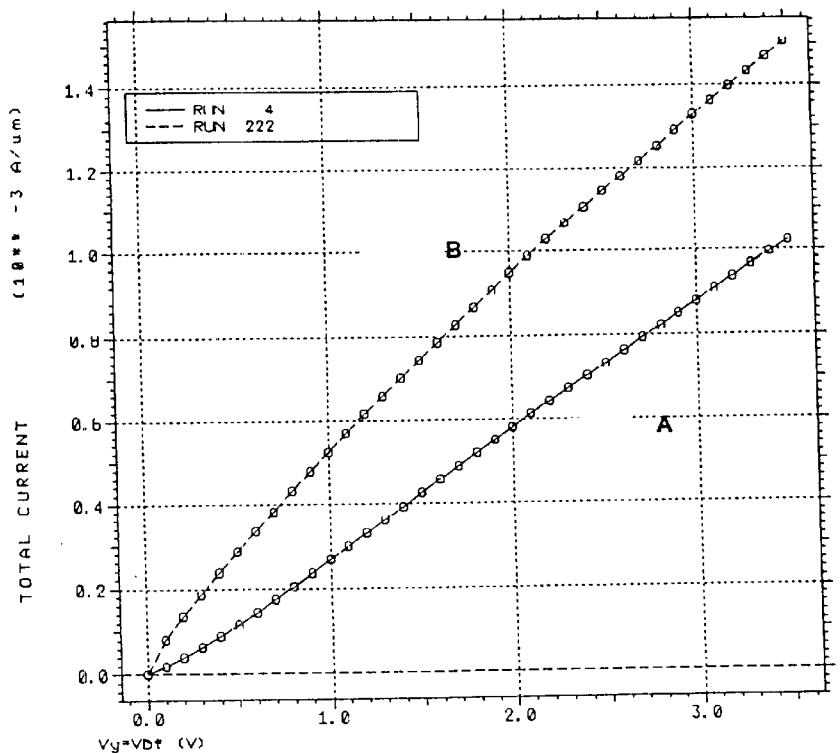
FIG. 7 is a graph showing the electrical characteristics of the modified vertical array devices according to the first and second embodiments of the present invention.

The contacting mechanism 25A of this embodiment differs from that of the conventional DRAM vertical transfer device 10 by having a vertical channel length $L_A$ shown in FIGS. 3A and 3B of only approximately 0.17 microns. In contrast, the vertical channel length L of the DRAM device 10 shown in FIG. 1 is approximately 0.22 microns. This reduction in the length of the channel, coupled with the reduced Vt and sensitivity derived from an intrinsic device, produces a series resistance path for the integrated vertical capacitor 10A that is significantly reduced. As a result, the resistance is constant over the entire voltage range and is not affected by the high threshold voltage/series resistance of the standard array device. These electrical characteristics of the modified vertical array device 10A of the first embodiment are represented by line A in FIG. 7.

The conventional DRAM vertical transfer device 10 has a nonlinear resistance of approximately 100 kΩ for a 0.175 micron width, and an RC time constant of approximately 4 nS given a 40 fF trench capacitance. In comparison, the array device 10A formed by the well and junction doping modification according to the first embodiment of the present invention has a linear resistance of approximately 18 kΩ and an RC time constant of only approximately 0.72 nS.

A second embodiment of the present invention will now be described by reference to FIGS. 5 and 6 of the drawings. In the second embodiment, the mechanism 25B used to contact the second capacitor 26 comprises a pair of overlapping or nearly overlapping diffusions 27, 30 spaced closely enough that current transport to the second capacitor 26 is by punch through. According to this embodiment, the depth of the buried node 27 is substantially reduced by moving the etched recess in the polysilicon of the second trench 28 closer to the top surface 31 of the structure. This is accomplished by increasing the aspect ratio (Depth/Width) of the second trench 28 as compared to the nominal size of the first trench 22 used for the DRAM device 10. The result is that the buried node diffusion 27 is merged with, or positioned sufficiently close to, the bitline diffusion 30 that current will readily pass between the diffusions 27, 30.

During fabrication, the first and second trenches 22, 28 are formed having substantially the same dimensions. The trenches 22, 28 are then filled with polysilicon 32 in a normal manner. However, before etching the polysilicon 32 to form a recess in each of the first and second trenches 22, 28, a suitable blocking mask is applied over the second trench 28 to increase the aspect ratio of the second trench 28 (i.e., make it narrower). Alternatively, the second trench 28 can itself be formed narrower and with an increased aspect ratio as compared to the first trench 22. The polysilicon 32 is then etched to form a recess in each of the trenches 22, 28. Since the aspect ratio of the second trench 28 is increased, the polysilicon 32 in the second trench 28 is etched much slower and much less than the polysilicon in the first trench 22. The recess formed in the second trench 28 by this slower etching is thus shallower than the recess formed in the first trench 22. The buried node 27 is then out diffused in the shallow recess at a location much closer to the surface 31 and to the bitline diffusion 30 than the buried node 13 of the DRAM device 10 located in the first trench 22.

Figure 5:
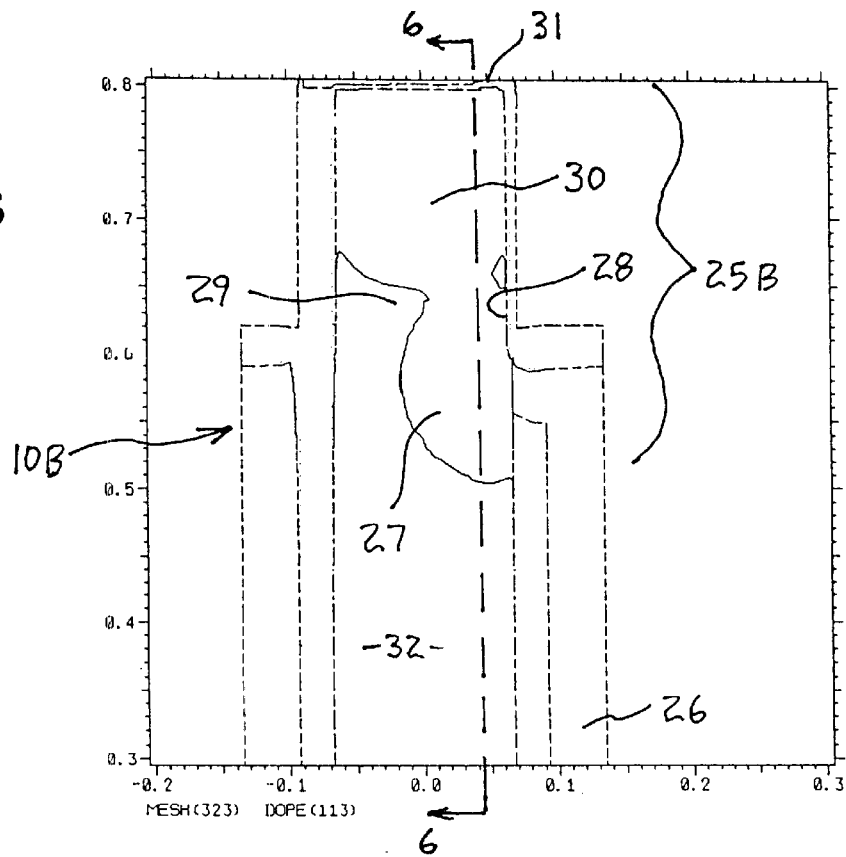
FIG. 5 is a two-dimensional cross section view of a doping profile of a modified vertical array device according to a second embodiment of the present invention.
Figure 6:
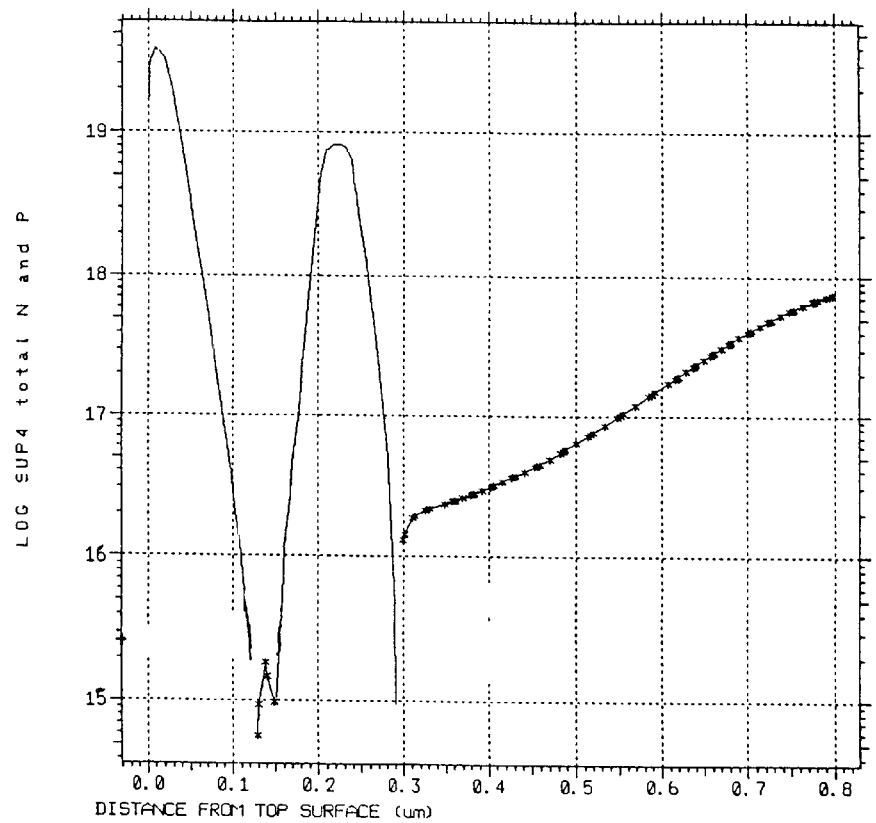
FIG. 6 is a one-dimensional view of the doping profile of the vertical array device of FIG. 5, as taken along line 6—6 in FIG. 5.

As shown in the cross section view of FIG. 5, the buried node 27 in the second trench 28 in the second embodiment is located sufficiently shallow that it merges with the bitline diffusion 30 located at the top of the trench 28. Thus, a direct connection is provided between the buried node 27 and the bitline diffusion 30 in the second trench 28, thereby providing an improved decoupling capacitor 10A on the same circuit chip as the DRAM vertical transfer device 10.

The well and junction doping modification described above in the first embodiment can be used in conjunction with the reduced node depth achieved with the second embodiment to further enhance the electrical characteristics. For example, the aspect ratio of the second trench 28 can be set such that the buried node 27 is nearly, but not quite, merged with the bitline diffusion, and the well and junction doping modification is used to ensure a merged bitline and buried node diffusion.

Experiments have demonstrated that the process according to this second embodiment is repeatable and well controlled, and can be tuned to within a process window nominal delta of 0.1 to 0.25 microns. In FIG. 5, the buried node 27 has been moved 0.15 microns closer to the surface as compared to the depth $L_A$ of the buried node 27 of the first embodiment shown in FIGS. 3A and 3B. At this level, the modified bitline 30 will merge with the buried node diffusion 27, as shown in FIG. 5. The one-dimensional doping profile shown in FIG. 6 for the second embodiment further illustrates this point.

The contacting mechanism 25B of the second embodiment differs from that of the conventional DRAM vertical transfer device 10 by having a zero-length vertical channel (i.e., the nodes 27, 30 are merged), or at least a substantially reduced length of the vertical channel, as compared to the channel length L of the DRAM device 10 shown in FIG. 1. This substantial reduction in the length of the channel 29 produces a direct contact path with a substantially reduced resistance and RC time constant. For example, the contact path of the second embodiment can have a linear resistance of approximately 13 kΩ and an RC time constant of only 0.52 nS. As shown by line B in FIG. 7, the resistance for this second embodiment is constant over the entire voltage range and is not affected by the high threshold voltage/series resistance of the standard array device.

A third embodiment of the present invention will now be described by reference to FIGS. 8 to 11 of the drawings. In the third embodiment, the mechanism 25C used to contact the second capacitor 26 comprises a pair of merged diffusions 27, 30, as shown on the left side of FIG. 11. These merged diffusions 27, 30 provide a zero-length FET 25C that allows for a low resistance capacitor plate connection and can be integrated into the DRAM vertical cell structure. The zero-length FET 25C shown in FIG. 11 does not require an independent gate connection 33 to be used as a control element. The mechanism 25C provides a transistor link to the buried node 27 of the second transistor 26 having a much lower output resistance than the standard array set. Thus, the device is suitable for use as a decoupling capacitor 10C. The resulting structure of the third embodiment is similar to the structure of the second embodiment described above. However, the fabrication processes for each of the embodiments are different, as will be described below.

A fabrication process according to the third embodiment will be explained with reference to the cross section views of FIGS. 8 to 11. In each of these cross section views, a pair of vertical cell structures are shown in various stages of fabrication, wherein the cell structure on the left side is the novel integrated capacitor 10C according to the third embodiment, and the cell structure on the right side corresponds to a conventional DRAM vertical cell 10.

Figure 8:
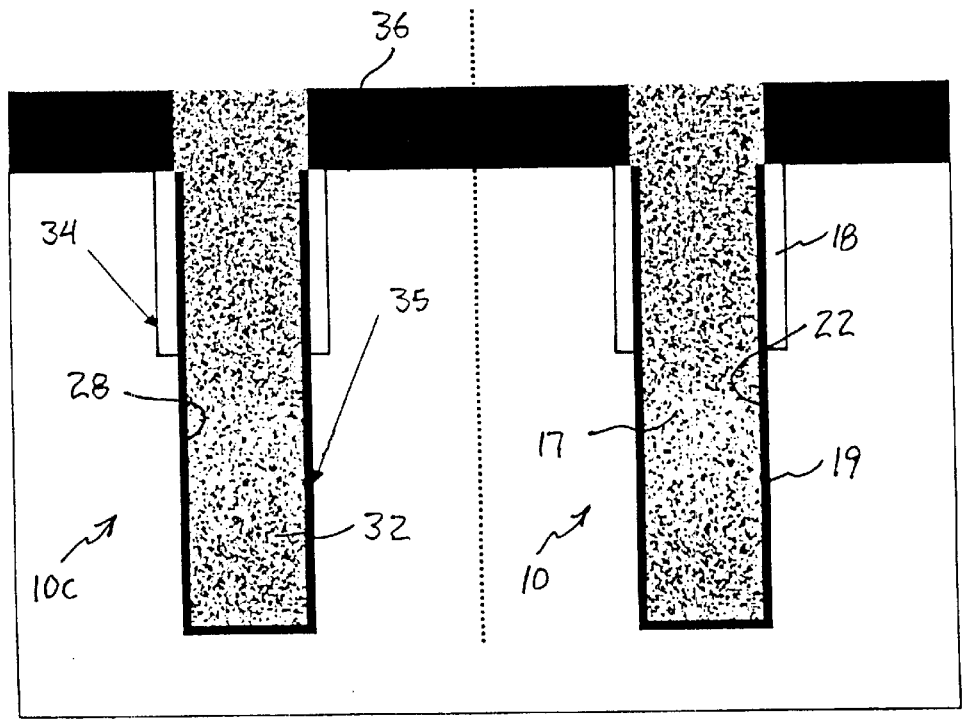
FIG. 8 is a cross section view of a trenched polysilicon filled structure ready for processing according to a third embodiment of the present invention.

In FIG. 8, the vertical cell structures are shown at the start of the process, after the trenches 22, 28 have been etched and the polysilicon fill 32 has been applied. An isolation oxide collar 18, 34 and nitride dielectric 19, 35 are formed within each of the trenches 22, 28 about the polysilicon fill 32. A top surface film of pad nitride 36 is also shown on the structure. The vertical cell structure on the left side corresponding to the integrated capacitor 10C and the vertical cell structure on the right side corresponding to the DRAM vertical cell 10 are identical at this stage of the fabrication process.

Figure 9:
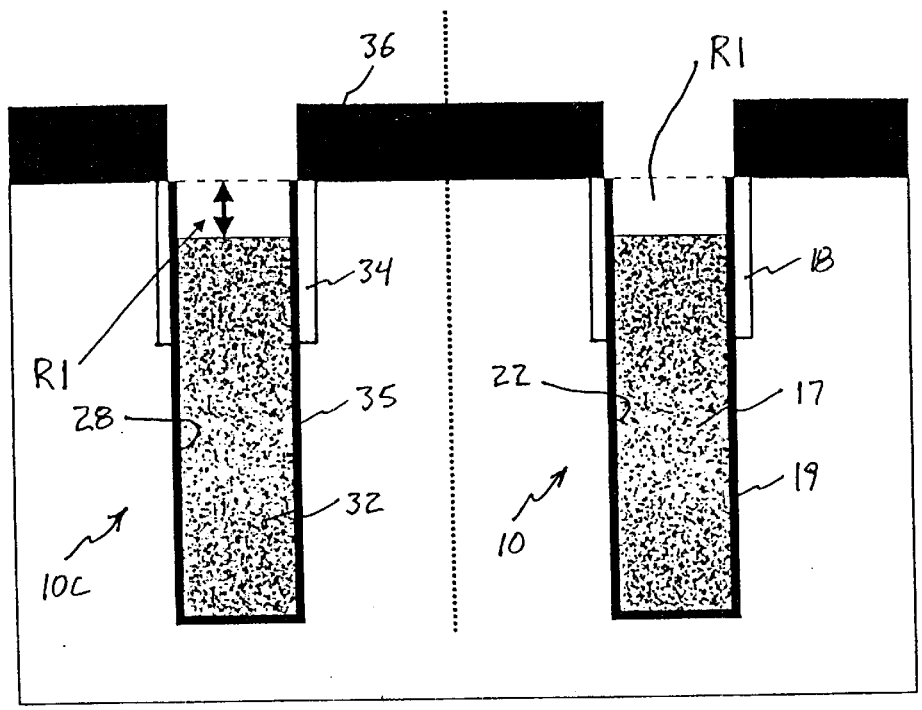
FIG. 9 is a cross section view of the structure shown in FIG. 8 with a first recess formed in each of the polysilicon filled trenches.

As shown in FIG. 9, a blanket etch selective to the nitride pad 36 is used to recess the polysilicon. This first recess R1 will provide a region where the integrated capacitor structure 10C will be fabricated. The vertical cell structures 10, 10C on the left and right sides are still identical at this stage of the fabrication process.

Figure 10:
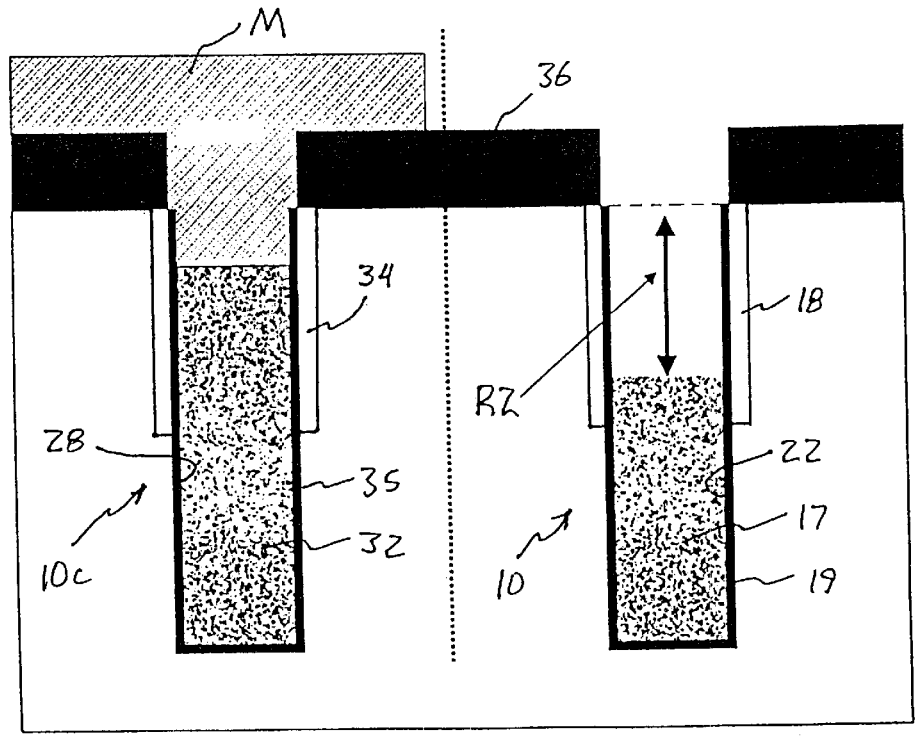
FIG. 10 is a cross section view of the structure shown in FIG. 9 with a mask applied over one of the trenches and a second recess formed in the other trench for a DRAM vertical cell.

As shown in FIG. 10, a mask M is placed over the cell structure corresponding to the integrated capacitor 10C to protect the polysilicon fill 32 from further etching. A second recess R2 is then formed in the cell structure corresponding to the DRAM vertical cell 10 to define the channel length of the DRAM vertical cell 10. The conventional process for forming a DRAM cell uses only one recess to set the depth of the buried diffusion 13. However, in the present invention the extra recess R2 is used to make the DRAM cell 10 deeper, while leaving the integrated capacitor 10C at the same depth controlled by the first recess R1.

Figure 11:
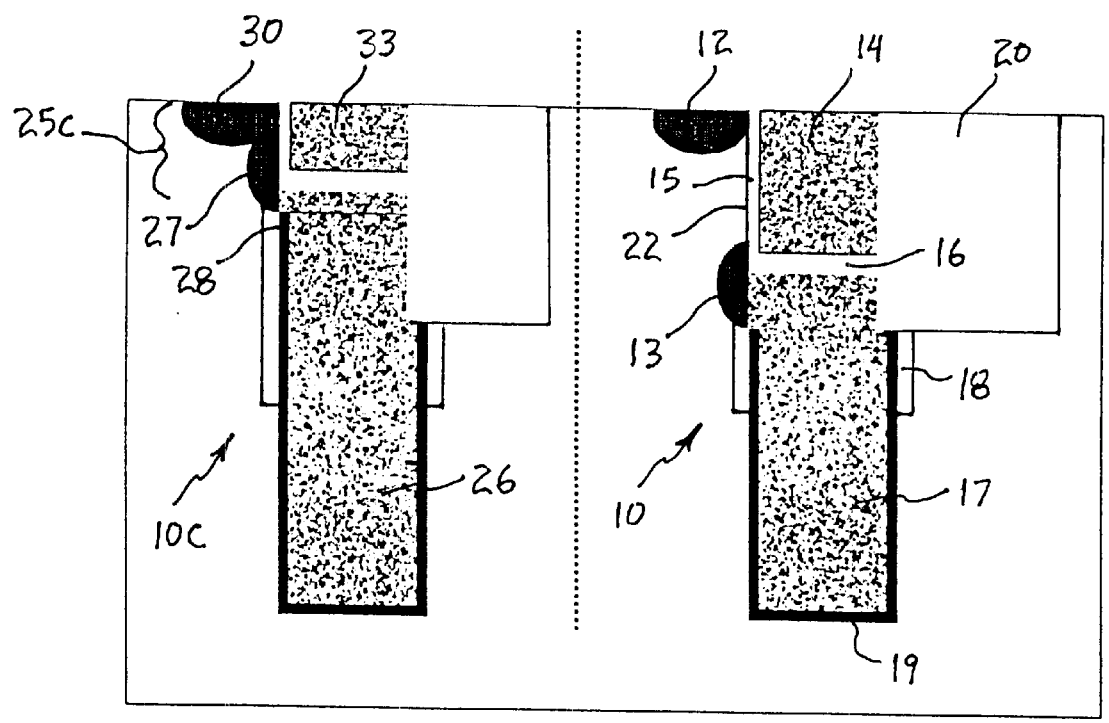
FIG. 11 is a cross section view of the completed device according to the third embodiment of the present invention with an integrated capacitor formed on the left side and a DRAM vertical transfer device formed on the right side.
Figure 12:
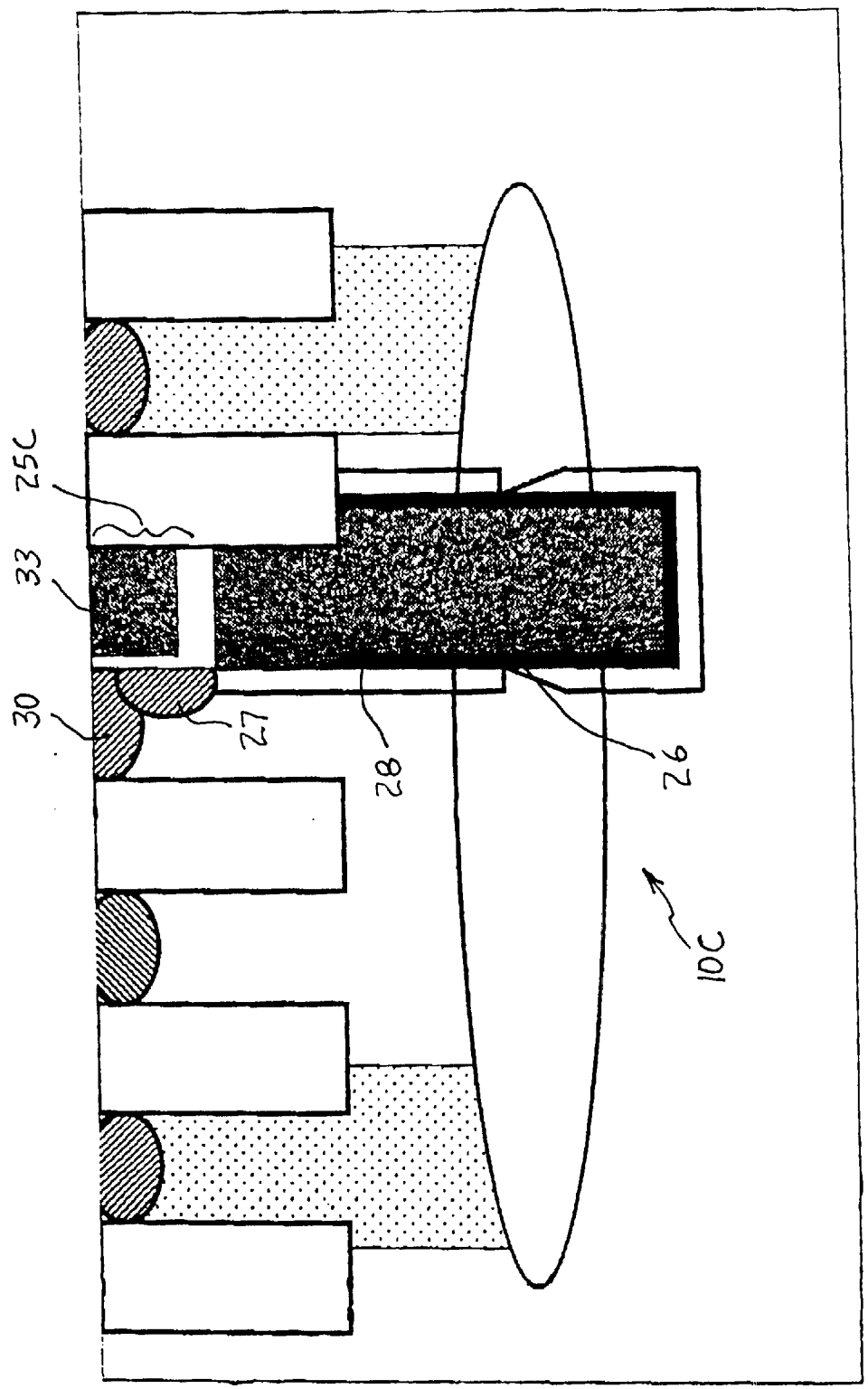
FIG. 12 is a cross section view of the decoupling capacitor elements of the integrated capacitor shown on the left side of FIG. 11.

The final structures of the integrated capacitor 10C and the DRAM vertical cell 10 are shown in FIG. 11. FIG. 12 shows all of the decoupling capacitor elements of the integrated capacitor 10C. Bitline diffusions 30, 12 are provided at the top of each of the integrated capacitor 10C and the DRAM vertical cell 10, respectively, and buried diffusions 27 are provided below each of the bitline diffusions. In the case of the integrated capacitor 10C, the bitline diffusion 30 and the buried diffusion 27 are directly merged to create a shorted connection. In the case of the DRAM vertical cell 10, the buried diffusion 13 is spaced from the bitline diffusion 12 using an appropriate recess depth to form a standard array device. Transfer gates 33, 14 are provided in both the integrated capacitor 10C and the DRAM vertical cell 10, but the gate 33 does not need to be connected in the integrated capacitor 10C. Direct access to the storage capacitor 26 of the integrated capacitor 10C is provided through the merged diffusions 27, 30. Since the diffusions 27, 30 are merged, there is no doping or p-well between them.

In the first and second embodiments described above, the diffusions 27, 30 are not necessarily overlapping or merged. Instead, the concept of a low resistance, punch-through FET 25A, 25B is provided as the contacting mechanism in these embodiments. On the other hand, the third embodiment described above, which uses a two-recess trench process, can be easily controlled to provide an absolute merging of the diffusions 27, 30 to form a low resistance plate connection 25C. All of these embodiments preserve the nature and integrity of the standard vertical DRAM device 10, and create a new integrated capacitor device 10A–10C which is useful for high frequency decoupling.

In another embodiment of the present invention, an integrated circuit chip is provided having an anti-fuse formed together with a DRAM vertical transfer device. An anti-fuse refers to a device having an electrically high resistance (open) in its unprogrammed state and an electrically low resistance (closed) in its programmed state. An anti-fuse is a useful device, for example, in enabling on-chip circuit repair. By selective control of high applied voltage across a thin dielectric, a field assisted permanent breakdown of the dielectric to the surrounding material (in this case N+ doped silicon to N+ doped polysilicon) results in a high pre-fuse resistance to a low post-fuse resistance path that can be differentially sensed by an on-board latch. Two implementations of a trench capacitor anti-fuse will be described below, building upon the decoupling capacitors described above.

A typical unprogrammed (pre-fuse)/programmed (post fuse) resistance of an anti-fuse is $10^7$ vs $10^3$ ohms, with the unprogrammed resistance limitation imposed by the sensing circuitry (the actual unprogrammed R is on the order of $10^{10}$ ohms). Minimizing the parasitic resistance path to the anti-fuse element is an important design objective, and can be accomplished by the mechanism described herein. A typical programmed anti-fuse trench capacitor exhibits a post fuse resistance of approximately 20 KΩ. Combining this result with the parasitic resistance values previously described (also approximately 20 KΩ) leads to a total programmed resistance of 40 KΩ, which is adequate for typical circuit designs.

Figure 13:
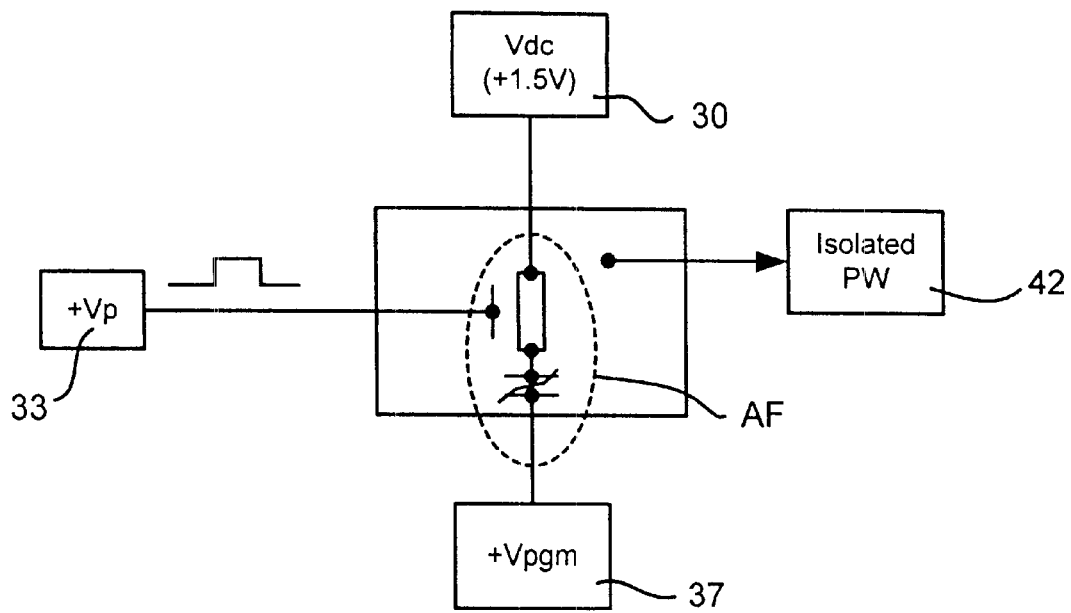
FIG. 13 is an anti-fuse circuit according to a fourth embodiment of the present invention, in which the inner anti-fuse connection is provided through a vertical FET program and sense transistor.
Figure 14:
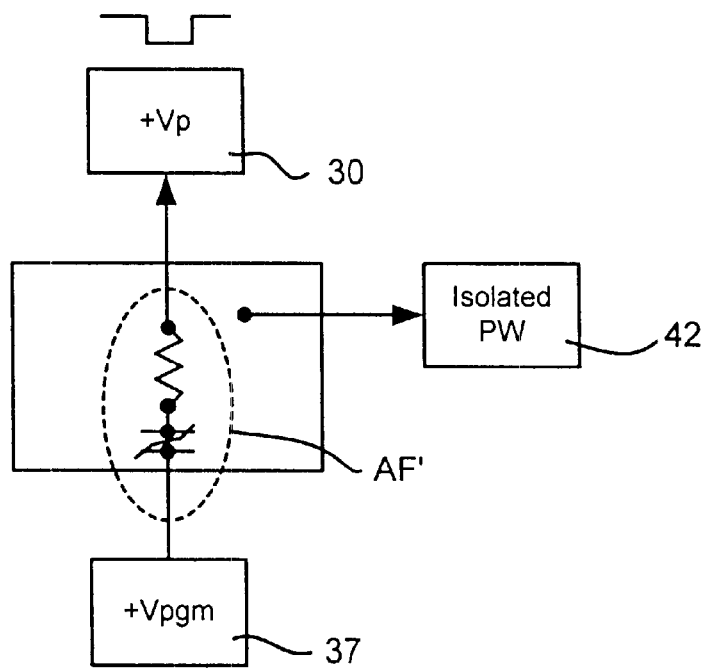
FIG. 14 is an anti-fuse circuit according to a fifth embodiment of the present invention, in which the inner anti-fuse connection is provided through a merged diffusion of the vertical FET.

In the anti-fuse embodiments, the same structures described above for the decoupling capacitors shown in FIGS. 3 to 12 are utilized. Thus, the structures shown in FIGS. 3A and 12 represent the unprogrammed state of anti-fuses according to fourth and fifth embodiments of the present invention, respectively. FIGS. 13 and 14 show the circuit implementation of the anti-fuse structures of the fourth and fifth embodiments, respectively.

In the circuit implementation of FIG. 13, the buried plate 37 is connected to a high potential Vpgm. Since the heavily doped N+ common outer anti-fuse plate 37 extends through all anti-fuses, it is a logical source of a charge reservoir required to assist in the current available during programming. The inner anti-fuse connection is provided through the vertical FET program and sense transistor AF, which corresponds to the FET element 25A in FIGS. 3A and 3B. A common level Vdc is connected to each diffusion 30 in parallel, thus saving the space of a unique connection to each transistor. A typical voltage level of 1.5 V is shown, although other voltages may be appropriate depending on the transistor operational design requirements. The program/sense transistor AF is accessed by pulsing the gate 33 of the specific anti-fuse through a Vp line. The high voltage path 37 to 30 is isolated from the latch circuitry by the gate 33. This subsequently allows for the powerful technique of parallel programming, as the latches and external logic are not loaded by the anti-fuse program path. The isolated p-well 42 is also tied to ground. The isolated p-well 42 does not play an essential programming function, but it does allow for the protection of surrounding CMOS circuitry by collecting all transient carriers generated during the program event. Reading the anti-fuse (programmed or unprogrammed) is accomplished using standard CMOS levels.

In order to sense the anti-fuse AF, it is desirable to have a low voltage path through the anti-fuse, where either the programmed or unprogrammed state can be determined, using the standard internal chip power supply levels. This is accomplished by grounding the program line 37 (leaving the isolated p-well 42 also at ground), connecting the common FET diffusion 30 to the internal chip power supply (e.g., 1.5 V), and subsequently pulsing each gate electrode 33 by the read latch (not shown). The resistance of a programmed anti-fuse AF will subsequently cause those latches to flip state, hence the anti-fuses are read.

Following an operating chips power-up cycle, where all anti-fuses are read and interrogated, those anti-fuses that are not programmed can be utilized as decoupling capacitors. Since each gate electrode 33 is internally addressable, those anti-fuses identified as "unprogrammed" can be redeployed internally to be used as decoupling capacitors.

An anti-fuse device according to the fifth embodiment will now be described with reference to FIG. 14. The circuit implementation of FIG. 14 corresponds to the previously described decoupling capacitor structure shown in FIG. 12, now to be utilized as an anti-fuse, in the unprogrammed state.

In FIG. 14, the buried plate 37 is connected to a high potential Vpgm. The inner anti-fuse connection AF' is provided through merged diffusion of the vertical FET 25C, as previously described and shown in FIG. 12. A pulsed level Vp is connected to each diffusion 30, eliminating the need for the gate electrode 33, and thus saving the space of a unique gate to each transistor. In this implementation, the fuse program circuitry internal to the chip can be used to handle the voltage and current levels for programming the anti-fuse, or an external isolating device can be added to remove the internal circuitry from the programming voltage and read the FET diffusion 30.

The anti-fuse structure according to the fifth embodiment provides a compact, vertical scheme that minimizes the space required to connect the isolated p-well 42 and program node 37 shared among a plurality of anti-fuses The embodiments and examples set forth herein were presented in order to best explain the present invention and its practical application and to thereby enable those skilled in the art to make and use the invention. However, those skilled in the art will recognize that the foregoing description and examples have been presented for the purposes of illustration and example only. The description as set forth is not intended to be exhaustive or to limit the invention to the precise form disclosed. Many modifications and variations are possible in light of the above teachings without departing from the spirit and scope of the following claims.

What is claimed is:

1. An electronic structure comprising an integrated circuit chip, said chip comprising a first capacitor and an electrical element, wherein contact to said first capacitor is through a first mechanism comprising a vertical transistor, and contact to said electrical element is through a second mechanism that differs from said first mechanism, wherein both said first capacitor and said electrical element have a buried node.

2. The electronic structure as recited in claim 1, wherein said vertical transistor is a FET.

3. The electronic structure as recited in claim 1, wherein said first capacitor is in a first trench and said electrical element is in a second trench.

4. The electronic structure as recited in claim 3, wherein said vertical transistor has a vertical gate located in said first trench.

5. The electronic structure as recited in claim 1, wherein said second mechanism is a resistor.

6. The electronic structure as recited in claim 5, wherein said resistor comprises a diffusion.

7. The electronic structure as recited in claim 6, wherein said diffusion includes deposited doped poly.

8. The electronic structure as recited in claim 7, wherein said second trench comprises a sidewall dielectric, and said deposited doped poly is located over said dielectric.

9. The electronic structure as recited in claim 6, wherein said diffusion includes an implant.

10. The electronic structure as recited in claim 1, wherein said vertical transistor comprises a source/drain implant region, and said second mechanism comprises a source/drain implant region and an additional implant region.

11. The electronic structure as recited in claim 1, wherein said vertical transistor comprises a channel implant region, and said second mechanism excludes a channel implant region.

12. The electronic structure as recited in claim 1, wherein said second mechanism comprises a pair of overlapping or nearly overlapping diffusions.

13. The electronic structure as recited in claim 12, wherein said pair of diffusions are sufficiently close together to allow punch-through current transport therebetween.

14. The electronic structure as recited in claim 12, wherein said first capacitor is in a first trench and said electrical element is in a second trench, said first trench comprises a first recess and said second trench comprises a second recess, said first recess being shallower than said second recess, and a doped material within each said recess, wherein one diffusion of said pair of diffusions is associated with said doped material in said first recess.

15. The electronic structure as recited in claim 12, wherein said second mechanism comprises a third diffused region that bridges said pair of diffusions.

16. The electronic structure as recited in claim 15, wherein said third diffused region comprises an ion implant.

17. The electronic structure as recited in claim 1, wherein said mechanism comprises a low resistance contact.

18. The electronic structure as recited in claim 1, wherein said second electrical element is a second capacitor.

19. The electronic structure as recited in claim 1, wherein said electrical element is an anti-fuse.

* * * * *